United States Patent [19]

Gersbach

[11] 4,193,127

[45] Mar. 11, 1980

[54] SIMULTANEOUS READ/WRITE CELL

[75] Inventor: John E. Gersbach, Burlington, Vt.

[73] Assignee: International Business Machines Corporation, Armonk, N.Y.

[21] Appl. No.: 58

[22] Filed: Jan. 2, 1979

[51] Int. Cl.² .......................................... G11C 11/40
[52] U.S. Cl. .................................. 365/174; 365/189; 365/238; 307/238
[58] Field of Search ............... 365/154, 156, 174, 189, 365/220, 221, 238; 307/238

[56] References Cited

U.S. PATENT DOCUMENTS

| 3,795,898 | 3/1974 | Matha et al. | 365/154 |
| 3,955,182 | 5/1976 | Bert | 365/154 |

*Primary Examiner*—Terrell W. Fears
*Attorney, Agent, or Firm*—Francis J. Thorton

[57] ABSTRACT

A memory array having improved cross coupled cells arranged in rows and columns and provided with means that permit the speedy direct transfer of data from one cell in the array into another cell in the array while simultaneously reading the data. Each of the cells is provided with a pair of read transistors and is coupled between a pair of bit sense lines. A different pair of bit sense lines is associated with each column of cells. Each cell is, in turn, provided with a pair of write transistors and is coupled between a pair of write lines. A different pair of write lines is associated with each column of cells in parallel to the bit sense lines. Read and write decodes are coupled to rows of cells arranged orthogonal to the columns of cells. Means are provided for coupling the bit line data of the cell being read to the write lines of another cell in the array so as to transfer directly the information read from the first cell in one row of cells into a second cell in a different row of cells while simultaneously reading the information being transferred.

12 Claims, 2 Drawing Figures

SIMULTANEOUS READ/WRITE CELL

BACKGROUND OF THE INVENTION

1. Field of the Invention

The present invention relates to memory arrays provided with circuits for reading information from cells in the array and simultaneously transferring this information into other cells in the array.

2. Description of Prior Art

It is well known that cross coupled bistable circuits known as "flip-flop" circuits can be used as cells for storage of information in memory arrays.

U.S. Pat. No. 3,177,374 issued Apr. 6, 1965, discloses a binary data transfer circuit which employs a conventional flip-flop circuit as the memory cell. To each cell there is coupled a transfer circuit for transferring data stored in each cell into a second cross coupled cell.

U.S. Pat. No. 3,675,218 issued July 4, 1972, to the same assignee as the present invention, discloses an array in which information can be written into any part of the array while different information is being read from a different portion of the array.

U.S. Pat. No. 3,504,351 issued Mar. 31, 1970, to the same assignee as the present invention, describes a matrix of bistable data array cells in which information can be transferred between cells coupled to the same sense line, with each cell being conditioned to receive the information also being conditioned to inhibit the propagation of the signal to other cells further along the sense line.

SUMMARY OF THE INVENTION

The present invention discloses a plurality of bipolar cross coupled cells arranged in a memory array configuration which is provided with means for reading the information from selected cells in the array and simultaneously rewriting this same information into other selected cells in the array.

Each cell of the array of the present invention is a conventional cross coupled transistor flip-flop storage circuit used for the storage of binary coded information. This information is stored in the cell as binary 1 or a binary 0. Control circuits are provided so that entire rows of cells can be activated so that the information stored in one row of cells can be retrieved and also transferred into another row of cells.

Thus, by activating the read control circuit for one row of the array and the write control circuit for a second row of the array the information being retrieved from the first row of cells in the array can be read and simultaneously transferred to the second row of cells.

Accordingly the invention describes a memory array in which the speedy direct transfer of data from one cell in the array into another cell in the array is achieved while simultaneously extracting and reading the information stored in the array.

This invention is especially useful in high performance microprocessors as the local store.

DESCRIPTION OF THE PREFERRED EMBODIMENT

Figure 1:
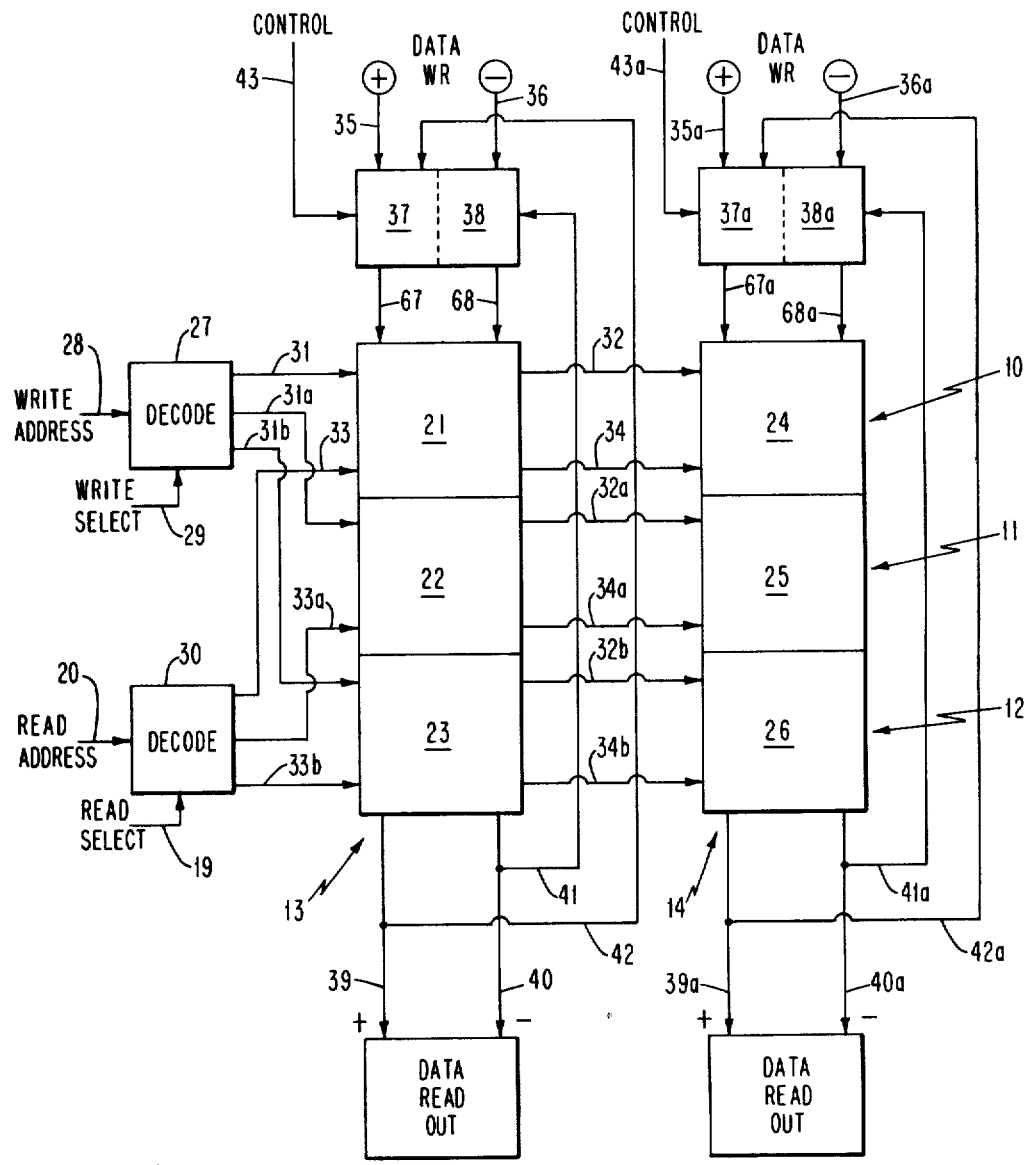
FIG. 1 is a block diagram of an array of storage cells with the required peripheral circuits.

FIG. 1, shows a memory array according to the invention formed of a plurality of storage cells arranged in six cell matrix. It should be understood of course, that the matrix shown can be expanded in any direction without affecting the present invention. The array shown in FIG. 1, is arranged to have three rows 10, 11 and 12 and two columns 13 and 14. The six cells 21, 22, 23, 24, 25 and 26 are arranged so that cells 21 and 24 form the first row 10, cells 22 and 25 form the second row 11 and cells 23 and 26 form the third row 12. Cells 21, 22 and 23 form the first column 13, cells 24, 25 and 26 form the second column 14. The columns of cells form the bit dimension and the rows 10, 11 and 12 are the word dimension of the array. Each row of cells is driven by two decode circuits 27 and 30. The decode circuit 27 is a write decoder and determines the word to be written and the decode circuit 30 is the read decoder and determines which word is to be read. Each of the cells 21, 22, 23, 24, 25 and 26 are connected to the write decode circuit 27 which controls the writing of storage information into the cells and to the read decode circuits 30 which controls the reading of information from the cells. The cells 21 and 24 in the first row 10 of memory cells are connected via write word lines 31 and 32 to the write decode circuit 27 and via read word lines 33 and 34 to the read decode circuit 30. The other rows of cells are similarly connected to these decode circuits. Thus, the second row 11 of cells, 22 and 25, is connected to the write decode 27 via write word lines 31a and 32a and to the read decode 30 via read word lines 33a and 34a and the third row 12 of cells, i.e. cells 23 and 26, is connected to the write decode 27 via write word lines 31b and 32b and to the read decode 30 via read word lines 33b and 34b.

Each column of cells is provided with a pair of data write lines, a switching circuit and a pair of bit sense lines. Thus, column 13 comprised of cells 21, 22 and 23 has a pair of data write input lines 35 and 36 coupled through a pair of switching circuits 37 and 38 to the cells 21, 22 and 23 via a pair of write lines 67 and 68 common to all the cells in the column. These cells are also all connected to common bit sense lines 39 and 40. These bit sense lines 39 and 40 are coupled via feedback lines 41 and 42 to the switching circuits 37 and 38 respectively.

Column 14 is similarly connected to data write input lines 35a and 36a via switching circuits 37a and 38a and write lines 67a and 68a and to bit sense lines 39a and 40a connected to the switching circuits via feedback lines 41a and 42a.

The switching circuits 37 and 38 which could be a pair of AND circuits ORed together, are provided with a common control line 43 and the circuits 37a and 38a with a common control line 43a. The write decode circuit 27 is provided with a write address line 28 and a write select line 29 while the read decode circuit 30 is provided with a read address line 20 and a read select line 19. The switching circuits are arranged to pass either a write signal, from the data write input lines 35 and 36 or the feedback lines 41 and 42. The write decode circuit 27 in conjunction with a write address signal on line 28 and a word select signal on line 29 acts to select a given row of cells so that information may be written therein. The read decode circuit 30 is needed for information retrieval along the rows of cells. Reading of any selected row occurs when the read address line 20 and the read select line 19 have appropriate signals thereon.

Reading of a row of cells may be performed while simultaneously taking the information read and writing it into a different row of cells. Moreover, reading and writing operations can be performed simultaneously in the array in different rows of cells. Thus, for example, if the read decode 30 is driven to select the row 10 i.e. cells 21 and 24 for reading of the information contained therein, this information is read out via the bit lines 39 and 40 and 39a and 40a and can be simultaneously written into either one of the other rows 11 or 12 by causing the write decode circuit 27 to select one of the other rows of cells and coupling the feedback lines via the switching circuits to the cell write lines 67, 68, 67a and 68a. The information read from any particular row of cells can thus be immediately and directly transferred into any other row of cells without delay and without interferring with the reading of the information from the selected cells. The invention thus permits writing of information into one row of cells while information is being read from another row of cells.

Figure 2:
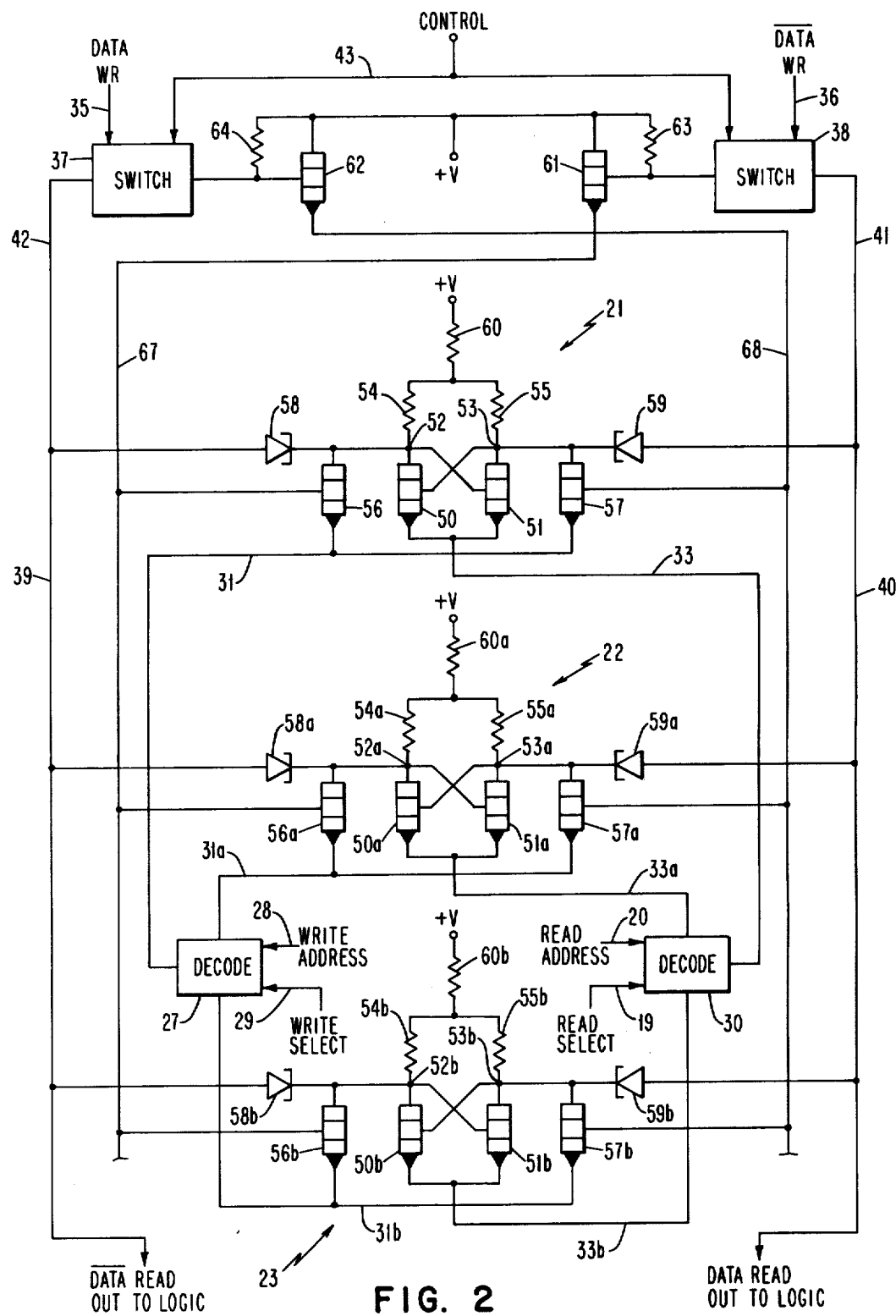
FIG. 2 is a schematic diagram of one embodiment of one of the columns of cells shown in FIG. 1.

FIG. 2, illustrates in greater detail column 13 and each of the cells 21, 22 and 23 contained therein together with the associated switching, decode and transfer circuits. As shown in the figure, each storage cell is identical to every other cell and thus only one need be described in detail. Cell 21, for example, comprises a pair of cross coupled transistors 50 and 51 arranged as a bistable flip-flop with the base of each connected to the collector of the other. Their emitters are connected together and to the read decode circuit 30 via read word line 33.

The collector electrode of each cross coupled transistor 50 and 51 in addition of being connected to the base of the other transistor is also connected through a respective node 52 and 53 to a respective one of a pair of parallel load resistors 54 and 55 which are in turn coupled together and are connected through a third resistor 60, to a voltage source +V. Resistor 60 could be common to all cells of a row.

A pair of write transistors 56 and 57 are provided in parallel with the cross coupled transistors 50 and 51. The emitters of the write transistors 56 and 57 are coupled together and to the write decode circuit 27 via write word line 31. The collector of each write transistor 56 and 57 is also coupled to a respective one of the nodes 52 and 53. The base of each write transistors 56 and 57 is coupled through a respective emitter follower transistor 61 and 62 to a respective one of the switching circuits 37 and 38. Thus, the base of write transistor 56 is coupled to the emitter of the emitter follower transistor 61 via line 67 and the base of write transistor 57 is coupled to the emitter of the emitter follower transistor 62 via line 68.

Also coupled to respective one of the nodes 52 and 53 are Schottky barrier diodes 58 and 59. These diodes are arranged so that the cathode of each is connected to the respective node and their anodes are connected to the respective bit sense lines 39 and 40.

The emitter follower transistors 61 and 62 have their collectors connected to a common voltage source +V and through respective resistors 63 and 64 to their respective bases. The bases of these emitter follower transistors 61 and 62 are also coupled to respective ones of the switching circuits 37 and 38. These switching circuits also have as inputs the data write lines 35 and 36 respectively and the control line 43. Feedback lines 41 and 42 are also respectively coupled to the switching circuits 38 and 37. Thus, feedback line 41 is coupled between switching circuit 38 and the bit sense line 40 and feedback line 42 is coupled between switch 37 and bit sense line 39.

As indicated above, each of the other cells in the array are identical to the cell thus described. Thus, the like elements in cell 22 have been identified by the like numbers which identify the units in cell 21 with the addition with the suffix a, while in cell 23 the suffix b has been added to the identifying number.

The device thus described operates as follows:

It will be assumed that the cell 21 is already written into and the cell 22 is to have information transferred thereto from cell 21. Cell 23 will be assumed to be left in a standby condition. It will also be assumed that in the cell 21 transistor 50 is conductive, and transistor 51 is nonconductive and that the conduction of transistor 50 and non-conduction of transistor 51 indicates a one stored in the cell 21. To select a particular word or row for reading, a read address pulse is applied to line 20 together with a negative read select pulse on line 19. Both are fed into the decoder 30 causing the read word line 33 to be pulled down hence the emitters of the two cross coupled transistors 50 and 51 also become pulled down from their quiesent or standby state. When the emitters of the transistors 50 and 51 become pulled down, current flow through the transistor 50 is substantially increased over the standby current normally passing through this device when the line 33 is at its normal quiesent voltage. This increasing current through device 50 causes the node 52 to also be pulled below its quiesent voltage level which in turn causes the Schottky barrier diode 50 to become conductive and pull the bit line 39 down to approximately the level of node 52.

Because the transistor 51 was nonconductive, node 53 remains substantially at its quiesent level and diode 59 remains nonconductive. The bit line 40 also remains undisturbed and at its quiesent voltage level. This causes the information now stored in the cell to appear across the two bit lines 39 and 40 as a differential voltage that can be read by suitable data read circuits.

If it is desired to simultaneously transfer the information read from cell 21 into one of the other adjacent cells, such as cell 22, then it is necessary that while cell 21 is being read that cell 22 is set into a write condition. Cell 22 is set in this write condition by applying a negative write select pulse to the write select line 29 together with a suitable write address on line 28, so that the write word line 31a in cell 22 is pulled below its quiesent level. This pulls down the emitters of the write transistors 56a and 57a and sets the write transistors 56a and 57a into conduction whereby information can be introduced into the cell 22 via the write bit lines 67 and 68.

The information appearing on the read bit lines 39 and 40 due to the reading of cell 21 can be made to also appear on the write bit lines 67 and 68 by setting the control line 43 such that the switching circuits 37 and 38 are set to pass information from the read bit lines 39 and 40 via the feedback lines 41 and 42 to the write bit lines 67 and 68. If a suitable control signal is fed into the switching circuits 37 and 38 such that the feedback lines 41 and 42 are now coupled to the bases of the emitter follower transistors 62 and 61, then, in the indicated instance, when cell 21 is being read the feedback line 42 connected to the bit line 39 is also pulled down to approximately the level of node 52. This signal when applied to the base of transistor 62 via switch 37 causes transistor 62 to be held nonconductive. Simultaneously the quiescent voltage on the bit line 40 is coupled to the base of transistor 61 via the feedback loop 41 and switch 38 causing transistor 61 to be turned on. When transistor 61 becomes turned on the base voltage of all the write transistors 56, 56a and 56b all rise towards +V. However, because only the transistors 56a has its emitter pulled below its quiesent voltage, only the write transistor 56a turns on while transistors 56 and 56b remain off. This causes the node 52a and the base of transistor 51a to be pulled towards the voltage set on line 31a by write decoder 27 causing the transistor 51a to be turned off if it were on. Because of the cross coupling of transistors 50a and 51a, the transistor 50a turns on. Thus, the two transistors 50a and 51a become set to the same state that transistors 50 and 51 in cell 21 were at when they were read. Because of the write decode, write word lines 31 and 31b to cells 21 and 23 remains at their normal quiesent voltage and the voltage applied to the write line 67 is insufficient to write either cell 21 or 23. Because the emitter follower transistor 62 is held off by the read bit line 39 voltage, the write transistors 57, 57a and 57b all remain nonconductive and the nodes 53, 53a and 53b all remain relatively undisturbed. Although the information has now been read from cell 21 and transferred into cell 22, the reading was not destructive and the information still remains in cell 21.

Once cell 21 has been read and the information contained therein transferred into cell 22, new information can be entered in cell 21. This is accomplished as follows: suitable pulses are applied to the write select line 29 and the write address line 28 as to put the write decoder 27 into condition to select write word line 31 to cell 21. The other write word lines 31a and 31b remain at their quiesent voltage. The read decoder 30 is not turned on and all the read word lines 33, 33a and 33b remain at their quiesent voltage. Since in this case information is not being transferred from another cell, the read bit lines 39 and 40 are not used and the control line 43 is biased to set the switches 37 and 38 such that the data write input lines 35 and 36 are now clearly connected to the bases of emitter follower transistors 62 and 61. The information to be entered into cell 21 is now applied to the data write lines 35 and 36 and fed into the bases of the emitter follower transistors 61 and 62. If the state of cell 11 is to be changed from a 1 to a 0 the transistor 51 must be set into the conductive state and the transistor 50 made nonconductive. This is achieved by pulsing the data write line 35 positive and the data write line 36 negative. As a result the emitter follower transistor 62 becomes conductive and the emitter follower transistor 61 becomes nonconductive. When the emitter follower transistor 62 becomes conductive the write line 68 rises towards +V causing the base of write transistor 57 to rise and transistor 57 to become conductive. When the write transistor 57 becomes conductive then node 53 and the base of transistor 50 is pulled towards the write word line 31 causing transistor 50 to become nonconductive. Because of cross coupling the anode 52 rises causing the transistor 51 to become conductive. As transistor 51 turns on the node 53 remains low and transistor 50 remains off. The state of the cell 21 has now been switched from a 1 to a 0.

It should be understood that although a simple bipolar cross coupled cell has been described that other suitable cells may also be used without changing the concepts of the invention which utilizes feedback, in the bit dimension of an array, from a cell being read to the write inputs of another cell in the same bit dimension to transfer the read information without delay. It should also be noted that the emitter follower transistors 61 and 62 could be eliminated if the circuit is designed such that adequate signal levels can be obtained on the lines 67 and 68 even if the write transistors 56 and 57 go into saturation.

Additionally, the switches 37 and 38 could also be eliminated if so desired and the operation of the array changed to accomodate this switch elimination.

The present invention has a number of advantages namely, it is very quickly read and quickly written. Moreover, because the load resistors 54, 55 and 60 are all pinch resistors the circuit may be formed as an integrated circuit so that only a very low power is required. Additionally, when so designed as an integrated circuit an extremely high density will be realized.

It is readily apparent that various ways of accomplishing the transfer, storage and retrieval information may be interchanged from one cell to the other in order to optimize a particular array and it is considered within the ability of one skilled in this art to make such changes as are necessary to his particular design.

While the invention has been particularly described with reference to the preferred embodiments thereof, it will be understood by those skilled in the art that the foregoing and other changes in form and detail may be made therein without departing from the spirit and scope of the invention.

What is claimed is:

1. A memory array comprising;
    a plurality of memory cells arranged in orthogonal rows and columns,
    each of said cells comprising a pair of cross coupled transistors and a pair of write transistors,
    each of said cells being coupled to a pair of word lines and being coupled between a pair of read bit lines and a pair of write bit lines,
    each of said cross coupled transistors having its output node coupled to a respective one of said pair of read bit lines and its reference node coupled to one of said pair of word lines,
    each of said write transistors having its output node coupled to a respective one of said pair of read bit lines, its reference node coupled to the other of said pair of word lines and its control node coupled to a respective one of said write bit lines, and
    means coupling each one of said pair of read bit lines to a respective one of said pair of write bit lines for transferring the data read from a read cell in any row selected for reading into another cell in a row selected for writing that is in the same column as said read cell.

2. A memory array of information storage cells having first and second orthogonal axis comprising,
    a plurality of storage cells, each of said cells comprising a cross coupled transistor pair, read control circuit means, write control circuit means, read bit means and write bit means, each of said means being connected independently of the others to said cell,
    said read control circuit means including a decoder for selecting a first set of cells along said first axis for the reading of information from said first set of cells,
    said write control circuit means including a decoder for selecting a second set of cells along said first axis for the writing of information into said second set of cells, said read bit means being coupled to a third set of cells along said second axis for retrieving information read from one cell of said first set of cells, said third set of cells including one cell from said first set of cells and one cell from said second set of cells, said write bit means being coupled to said third set of cells along said second axis for writing information into one cell of said second set of cells and means coupling said read bit means to said write bit means whereby said information read from said one cell of said first set of cells is simultaneously written into said one cell of said second set of cells.

3. The array of claim 2 wherein said read bit means is a pair of read bit lines said write bit means is a pair of write bit lines, each of said transistors has an emitter, a base and a collector the emitters of said cross coupled transistors being connected in common and to said read control circuit means, the emitters of said write transistors being connected in common and to said write control circuit means, the collectors of each of said cross coupled transistors being connected in common to the collector of a respective one of the write transistors and to the base of the other of said cross coupled transistors and being coupled to a respective one of said pair of said read bit lines, the bases of each of said write transistors being connected to a respective one of said pairs of said write bit lines.

4. The array of claim 3 wherein the collectors of each of said cross coupled cells is coupled to said respective one of said read bit lines through a diode.

5. The array of claim 1 wherein said means coupling each one of said pair of read bit lines to a respective one of said pair of write bit lines comprises;

a feedback loop connecting each of said read bit lines to a respective one of said write bit lines.

6. The array of claim 5 wherein each of said feedback line further includes an emitter follower transistor having its base coupled to said one of said read bit lines and its emitter connected to said respective one of said pair of write bit lines.

7. The array of claim 6 wherein each of said feedback means further includes a respecitve switch, having a control input and a data write input, coupled between said one of said read bit lines and said respective one of said write bit lines.

8. The array of claim 7 wherein said switch comprises a pair of AND circuits having their outputs connected to an OR circuit.

9. The array of claim 3 wherein said coupling means comprises a pair of feedback loops, each of said feedback loops connecting one of said pair of read bit lines to a respective one of said write bit lines.

10. The array of claim 9 wherein each of said pair of feedback loops comprises a switch and a transistor coupled to said write bit lines as an emitter follower.

11. A memory array comprising;

a plurality of memory cells each cell being coupled to a word line and a pair of write bit lines, and being coupled between a pair of read bit lines, each of said memory cells comprising a pair of cross coupled transistors, each transistor having its output node coupled to a respective one of said pair of read bit lines and its reference node coupled to said word line, and means coupled between the said pair of read bit lines and the said pair of write bit lines for transferring the data read from the cell into any other selected cell in the array coupled to said write bit lines.

12. The memory array of claim 11 when said means comprises a feedback means coupled between each read bit line of said pair and one of said write bit line of said pair.

* * * * *